United States Patent
Gu et al.

(10) Patent No.: US 8,913,353 B2
(45) Date of Patent: Dec. 16, 2014

(54) METHOD AND SYSTEM FOR DETECTING FAULT OF SERIAL COIL TYPE PERMANENT MAGNET MOTOR

(71) Applicant: Korea Electronics Technology Institute, Seongnam-si, Gyeonggi-do (KR)

(72) Inventors: Bon Gwan Gu, Bucheon-si (KR); Jun Hyuk Choi, Seoul (KR); In Soung Jung, Seoul (KR); Joon Sung Park, Seoul (KR); Jin Hong Kim, Suwon-si (KR)

(73) Assignee: Korea Electronics Technology Institute, Seongnam-Si, Gyeonggi-Do (KR)

( * ) Notice: Subject to any disclaimer, the term of this patent is extended or adjusted under 35 U.S.C. 154(b) by 48 days.

(21) Appl. No.: 13/859,304

(22) Filed: Apr. 9, 2013

(65) Prior Publication Data
US 2014/0160602 A1 Jun. 12, 2014

(30) Foreign Application Priority Data
Dec. 7, 2012 (KR) .......................... 10-2012-0141828

(51) Int. Cl.
F21V 7/04 (2006.01)
(52) U.S. Cl.
USPC ............................................................ 361/31
(58) Field of Classification Search
USPC ........................................................... 361/31
See application file for complete search history.

(56) References Cited

U.S. PATENT DOCUMENTS

| 5,488,281 A * | 1/1996 | Unsworth et al. ............ 318/806 |
| 2007/0164691 A1 | 7/2007 | MacKay |
| 2010/0295491 A1 | 11/2010 | Schulz et al. |

FOREIGN PATENT DOCUMENTS

| KR | 1020070104923 A | 10/2007 |
| KR | 1020090056853 A | 6/2009 |

OTHER PUBLICATIONS

Korean Notice of Allowance for application No. 10-2012-0141828 dated Jan. 22, 2014.

* cited by examiner

*Primary Examiner* — Forrest M Phillips
(74) *Attorney, Agent, or Firm* — Lowe Hauptman & Ham, LLP

(57) ABSTRACT

A method and system for detecting a fault of a serial coil type permanent magnet motor includes driving the motor based on a predefined current reference value, detecting a phase current vector of the motor, and calculating a current compensation value for removing a negative sequence component of the motor based on the phase current vector. The current compensation value is provided to a negative sequence current controller for calculating a faulty phase and a degree of a fault of the motor using the output of the negative sequence current controller and a fault model to which induced magnetic flux variations in a specific slot of a specific faulty phase of the motor and other slots of the same phase as the specific phase are applied, and applying a current reference value to which the calculated faulty phase and degree of fault are applied.

8 Claims, 6 Drawing Sheets

METHOD AND SYSTEM FOR DETECTING FAULT OF SERIAL COIL TYPE PERMANENT MAGNET MOTOR

CROSS REFERENCE TO RELATED APPLICATION

This application claims the priority of Korean Patent Application No. 10-2012-0141828, filed on Dec. 7, 2012 in the KIPO (Korean Intellectual Property Office), which is incorporated herein by reference in its entirety.

FIELD

The present invention relates to a permanent magnet motor, and more particularly, to a method and system for detecting a fault of a serial coil type permanent magnet motor, to detect a phase having a stator coil winding inter-turn short circuit fault of the serial coil type permanent magnet motor and the quantity of the fault on the basis of a mathematical model.

BACKGROUND

In general, a motor includes a stator and a rotor. A small motor is constructed in such a manner that a permanent magnet is used as a stator, a coil is wound around a rotor and current is applied to the coil to make the rotor function as a permanent magnet such that the rotor rotates according to interaction between the stator and the rotor. In this structure, current is continuously supplied to the rotor even while the rotor rotates by means of a brush.

With the recent development of semiconductors, a permanent magnet is used as a rotor, a coil is wound around a stator and power is supplied to the stator. According to this structure, stators are sequentially magnetized to rotate the rotor magnetically corresponding to the stators. A motor of this type is called a permanent magnet synchronous motor (PMSM). The PMSM can minimize power consumption and improve system efficiency because a permanent magnet is used as a rotor to generate magnetic flux without using an external power supply.

The structure of the PMSM can be classified according to arrangement of a rotor and a stator. Particularly, a surface-mounted permanent magnet motor (SPM) having a permanent magnet attached to the surface of a rotor generates sinusoidal back electromotive force through the permanent magnet attached to a cylindrical shaft. The SPM generates a constant torque all the time when sinusoidal current is applied to an armature coil.

In a conventional motor structure, a stator coil is covered by an insulator such that inter-turn short circuit fault is not generated between the stator coil and a neighboring coil. However, the insulator covering the coil may age over time or be damaged due to power or spark induced into the motor. Accordingly, the insulator may be stripped off to expose the coil and the exposed coil and a neighboring exposed coil are short-circuited. To solve this coil turn circuit, a conventional fault detection method detects a motor fault only on the basis of a case in which power of a predetermined level is not output in initial operation of a motor, and thus the cause of the motor fault cannot be correctly detected and it is difficult to appropriately control the motor. Furthermore, since the conventional fault detection method experimentally applies a predetermined reference level, a considerable deviation and error are generated. To reduce the deviation and error, a large amount of experimental data needs to be acquired and thus efforts and expenses for the same are required.

SUMMARY

An object of the present invention is to provide a method and system for detecting a fault of a serial coil type permanent magnet motor to easily and accurately detect a fault due to inter-turn short circuit generated between internal coils, caused by damage of an insulator of a stator coil of the motor, and correctly detect a degree of the fault and a phase having the fault, facilitating analysis of the fault.

Another object of the present invention is to provide a method and system for detecting a fault of a serial coil type permanent magnet motor to control motor operation on the basis of a stable motor control operating point by estimating the quantity of fault current caused by inter-turn short circuit and appropriately limiting the quantity of fault current.

One aspect of the present invention provides a system supporting detection of a fault of a serial coil type permanent magnet motor. This system includes a serial coil type motor, a current sensor configured to sense stator phase current of the motor, and a compensation current calculator configured to calculate a current compensation value for a negative sequence component generated in the motor on the basis of the sensed phase current. The system further includes a positive sequence current controller configured to generate a control signal for an inverter control by using the current compensation value and also using a current reference value provided from a control system, a negative sequence current controller configured to generate a signal for removing the negative sequence component by using both the current compensation value and the current reference value, and then to provide the signal to the positive sequence current controller, an inverter configured to generate a motor operation signal according to the control signal, a fault detector configured to detect a faulty phase and a degree of a fault by applying the output of the negative sequence current controller to a mathematically defined fault model, and the control system configured to provide the current reference value to which the faulty phase and the degree of fault are applied. In this system, the fault model of the fault detector is a fault model to which a magnetic flux variation in a specific slot of a specific faulty phase of the motor and an induced magnetic flux variation in a slot of the same phase as the specific phase are applied.

In this system, the compensation current calculator may be further configured to convert a 3-phase voltage into a 2-phase synchronous reference frame, and then to calculate the current compensation value for compensating for the negative sequence component.

Also, balanced currents of the motor for compensating for the negative sequence component may be $$i_a = -I_q \sin\theta + I_d \cos\theta$$

$$i_b = -I_q \sin\left(\theta - \frac{2\pi}{3}\right) + I_d \cos\left(\theta - \frac{2\pi}{3}\right)$$

$$i_c = -I_q \sin\left(\theta + \frac{2\pi}{3}\right) + I_d \cos\left(\theta + \frac{2\pi}{3}\right).$$

And also, the motor may be a 3-phase motor and, and when a fault corresponding to x (the ratio of a faultless coil to a faulty phase and faulty pole pair) is generated in A-phase, a magnetic flux equation of the fault model may be $$\begin{bmatrix} v_a \\ v_b \\ v_c \\ 0 \end{bmatrix} = R_s \begin{bmatrix} i_a \\ i_b \\ i_c \\ i_f \end{bmatrix} + L_s \frac{d}{dt} \begin{bmatrix} i_a \\ i_b \\ i_c \\ i_f \end{bmatrix} + \omega \psi_m \begin{bmatrix} -\left(1 - \frac{2}{P}(1-x)\right)\sin\theta \\ -\sin\left(\theta - \frac{2\pi}{3}\right) \\ -\sin\left(\theta + \frac{2\pi}{3}\right) \\ -(1-x)\frac{2}{P}\sin\theta \end{bmatrix}$$

wherein $R_s$ and $L_s$ are $$R_s = \begin{bmatrix} R + (x-1)\frac{2}{P}R + R_f & 0 & 0 & -R_f \\ 0 & R & 0 & 0 \\ 0 & 0 & R & 0 \\ -R_f & 0 & 0 & (1-x)\frac{2}{P}R + R_f \end{bmatrix}$$

$$L_s = \begin{bmatrix} L_m\left(1 + \frac{2/P}{1-\gamma}(x^2-1) + \frac{\gamma 4/P}{1-\gamma}(1-x)\right) + \left(\frac{2}{P}x^2 + 1 - \frac{2}{P}\right)L_l & \left(-\frac{1}{2} + \frac{1-x}{P}\right)L_m & \left(-\frac{1}{2} + \frac{1-x}{P}\right)L_m & -(1-x)\gamma\frac{2}{P}\frac{L_m}{1-\gamma} + x(1-x)\frac{2}{P}\frac{L_m}{1-\gamma} \\ \left(-\frac{1}{2} + \frac{1-x}{P}\right)L_m & L_m + L_l & -\frac{1}{2}L_m & -\frac{1-x}{P}L_m \\ \left(-\frac{1}{2} + \frac{1-x}{P}\right)L_m & -\frac{1}{2}L_m & L_m + L_l & -\frac{1-x}{P}L_m \\ -(1-x)\gamma\frac{2}{P}\frac{L_m}{1-\gamma} + x(1-x)\frac{2}{P}\frac{L_m}{1-\gamma} & -\frac{1-x}{P}L_m & -\frac{1-x}{P}L_m & (1-x)^2\frac{2}{P}\frac{L_m}{1-\gamma} + \frac{2}{P}(1-x)^2 L_l \end{bmatrix}$$

wherein $v_a$, $v_b$, and $V_c$, denote phase voltages of the motor, f denotes a closed circuit generated caused by coil turn short, P is a pole number, P/2 is a pole pair number, $L_m$, and $L_l$ respectively denote self inductance and leakage inductance of each phase when the motor is in a normal state, R is a phase resistance component, $R_f$ is a contact resistance component generated due to inter-turn short circuit, x denotes the ratio of a faultless coil to a faulty pole, and $\gamma$ is a coupling factor of pole pairs in the same as a specific phase in a slot having the specific phase.

Additionally, fault current $i_f$ due to turn short circuit may be $$i_f = \frac{L_{s44}\left(R_{s41}\omega I_q + \omega^2\psi_m(1-x)\frac{2}{P} + \omega^2 I_d(L_{s41} - L_{s42})\right)\omega - R_{s44}(\omega I_q(L_{s41} - L_{s42}) - R_{s41}I_d)\omega}{R_{s44}^2 + (L_{s44}\omega)^2}\cos\omega t + \frac{R_{s44}\left(R_{s41}\omega I_q + \omega^2\psi_m(1-x)\frac{2}{P} + \omega^2 I_d(L_{s41} - L_{s42})\right) + L_{s44}(\omega I_q(L_{s41} - L_{s42}) - R_{s41}I_d)\omega^2}{R_{s44}^2 + (L_{s44}\omega)^2}\sin\omega t.$$

Furthermore, a synchronous reference frame value of a voltage value obtained by filtering the output of the negative sequence current controller may be as follows.

$$\begin{bmatrix} V_{de}^+ \\ V_{qe}^+ \end{bmatrix} = \frac{1}{3}\begin{bmatrix} I_d(R_{s11} + 2R_{s22}) + R_{s14}k_1 + \omega I_q(-L_{s11} + 2L_{s12} - 2L_{s22} + L_{s23}) + \omega k_2(L_{s14} - L_{s24}) \\ I_q(R_{s11} + 2R_{s22}) - R_{s14}k_2 - \omega I_d(-L_{s11} - 2L_{s22} + L_{s23} + 2L_{s12}) + \omega\psi_m\left(3 - \frac{2}{P}(1-x)\right) + \omega k_1(L_{s14} - L_{s24}) \end{bmatrix}$$

$$\begin{bmatrix} V_{de}^- \\ V_{qe}^- \end{bmatrix} = \frac{1}{3}\begin{bmatrix} I_d(R_{s11} - R_{s22}) + R_{s14}k_1 + \omega I_q(-L_{s11} + 2L_{s12} + L_{s22} - 2L_{s23}) + \omega k_2(L_{s14} - L_{s24}) \\ -I_q(R_{s11} - R_{s22}) + R_{s14}k_2 + \omega\psi_m\left(\frac{2}{P}(1-x)\right) + \omega I_d(-L_{s11} + 2L_{s12} + L_{s22} - 2L_{s23}) - \omega k_1(L_{s14} - L_{s24}) \end{bmatrix}$$

Another aspect of the present invention provides a method for detecting a fault of a serial coil type permanent magnet motor. This method includes the steps of: driving the serial coil type permanent motor based on a predefined current reference value; detecting a phase current vector of the motor; calculating a current compensation value for removing a negative sequence component of the motor based on the phase current vector; providing the current compensation value to a negative sequence current controller and calculating a faulty phase and a degree of a fault of the serial coil type permanent motor using the output of the negative sequence current controller and a fault model to which induced magnetic flux variations in a specific slot of a specific faulty phase of the serial coil type permanent motor and other slots of the same phase as the specific phase are applied; and applying a current reference value to which the calculated faulty phase and degree of fault are applied.

In this method, the step of applying the current reference value may include adjusting the velocity and phase current of the motor based on the faulty phase and degree of fault to suppress generation of overcurrent.

According to the present invention, the method and system for detecting a fault of a serial coil type permanent magnet motor can easily detect a motor fault simply on the basis of only the form and parameter of the motor using a model instead of a test, easily detecting faults of various motors.

Furthermore, the present invention can estimate motor fault current to operate the motor without exacerbating the motor fault.

DETAILED DESCRIPTION

In describing embodiments of the present invention, detailed descriptions of constructions or processes known in the art may be omitted to avoid obscuring appreciation of the invention by persons of ordinary skill in the art to which the present invention pertains.

Accordingly, the meanings of specific terms or words used in the specification and claims should not be limited to the literal or commonly employed sense, but should be construed or may be different in accordance with the intention of a user or an operator and customary usages. Therefore, the definition of the specific terms or words should be based on the contents of the specification. It should be understood, however, that there is no intent to limit the invention to the particular forms disclosed, but on the contrary, the invention covers all modifications, equivalents, and alternatives falling within the spirit and scope of the invention as defined by the claims.

Figure 1:
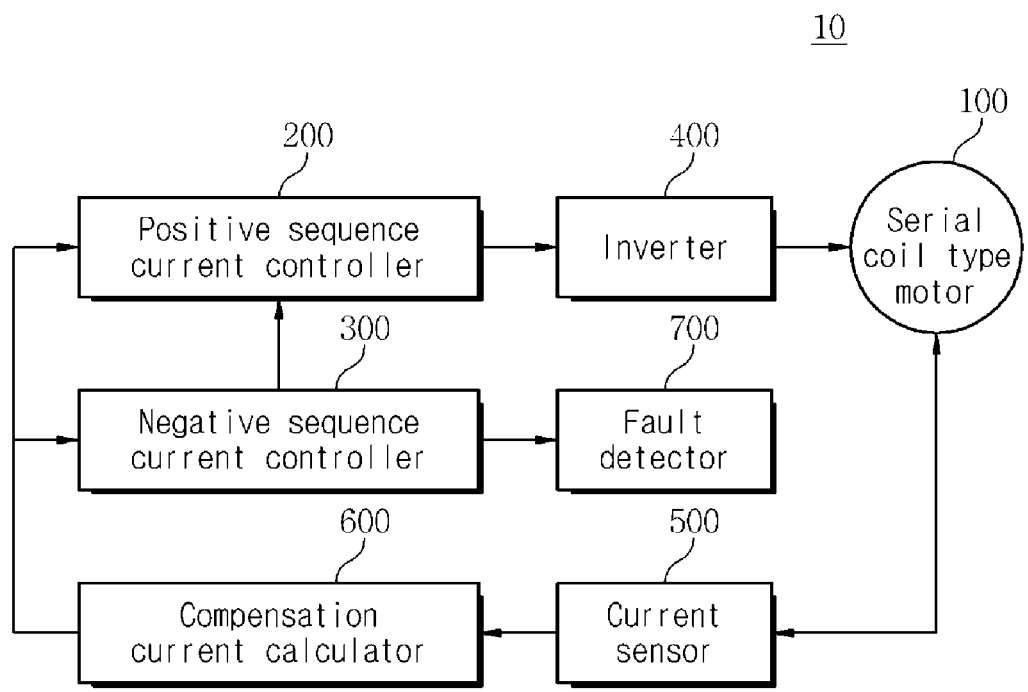
FIG. 1 is a block diagram illustrating the structure of a serial coil type permanent magnet motor to which a fault model according to an embodiment of the present invention is applied.
Figure 2:
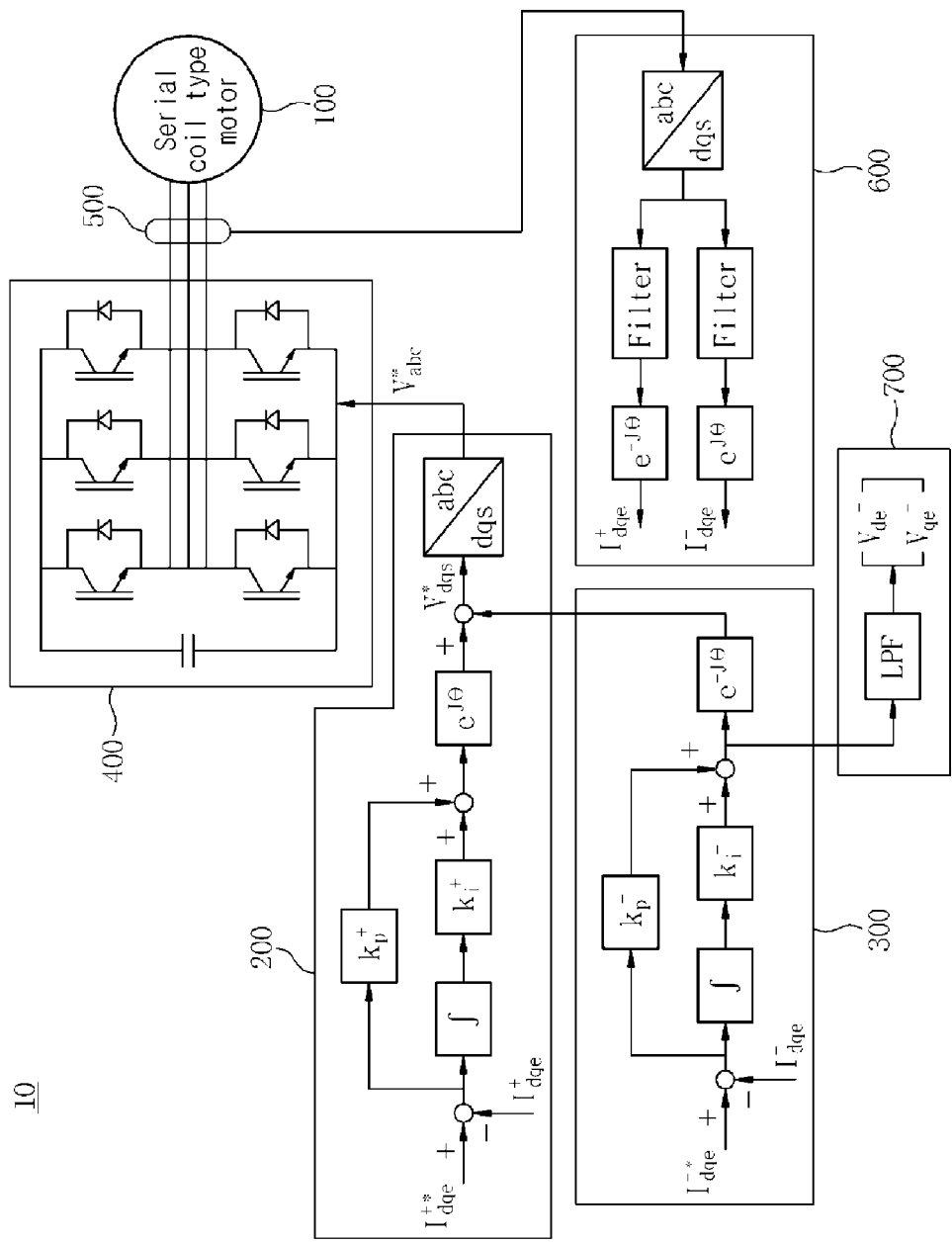
FIG. 2 is a circuit diagram illustrating the permanent magnet motor shown in FIG. 1.
Figure 3:
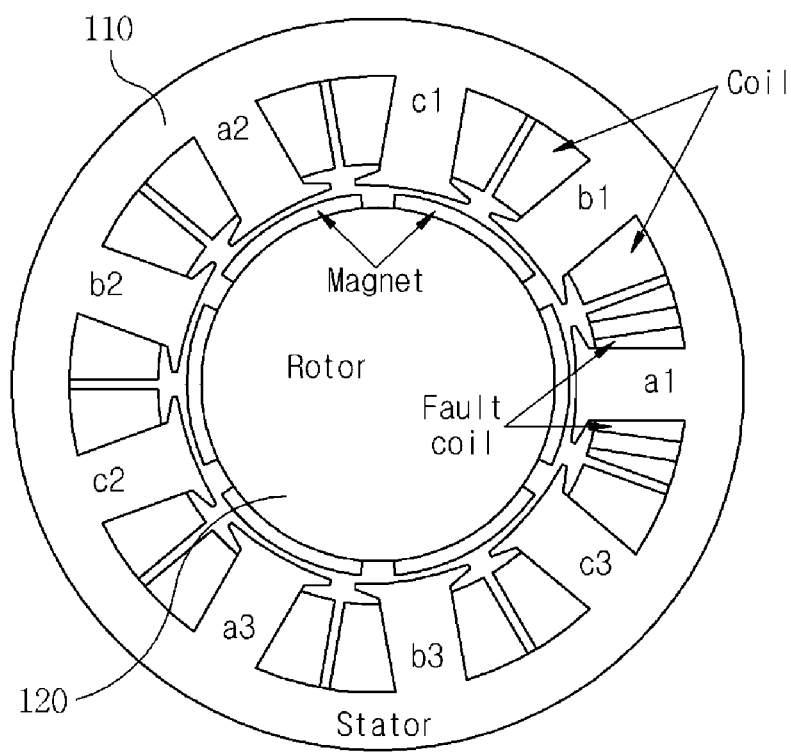
FIG. 3 illustrates a motor in the permanent magnet motor structure.
Figure 4:
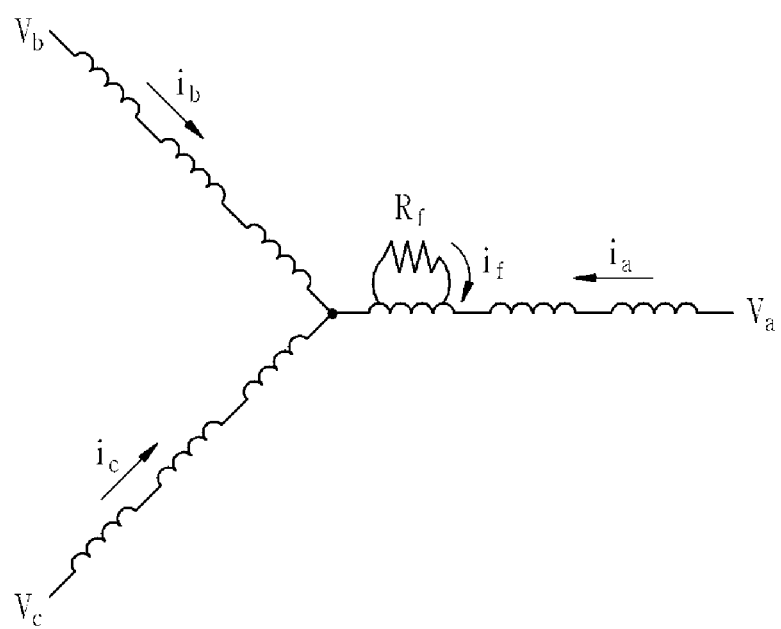
FIG. 4 shows an equivalent model for operation analysis of a motor having a fault.

FIG. 1 is a block diagram illustrating the configuration of a permanent magnet motor according to an embodiment of the present invention and FIG. 2 illustrates the configuration of the permanent magnet motor in more detail. FIG. 3 shows the appearance of a motor in the permanent magnet motor according to the present invention and FIG. 4 shows an equivalent model of a serial coil type motor according to the present invention.

Referring to FIGS. 1 to 4, a permanent magnet motor 10 according to the present invention may include a serial coil type motor 100, an inverter 400, a current sensor 500, a positive sequence current controller 200, a negative sequence current controller 300, a compensation current calculator 600 and a fault detector 700. The permanent magnet motor 10 according to the present invention may further include a control system capable of providing a current reference value using a degree of fault detected by the fault detector 700.

The permanent magnet motor 10 having the above-mentioned configuration according to the present invention can detect power generated when the serial coil type motor 100 is driven and construct a mathematical model relating to the serial coil type motor 100 on the basis of the detected power. In this process, the permanent magnet motor 10 can confirm whether a fault, for example, inter-turn short circuit is generated in a stator of the serial coil type motor 100 using a pre-designed fault model. Particularly, the permanent magnet motor 10 according to the present invention can mathematically detect the form of a fault using a fault model derived from a model of the serial coil type motor 100 and detect not only a fault of the serial coil type motor 100 but also a degree of the fault and a phase having the fault.

The serial coil type motor 100 operates according to a control signal provided by the inverter 400. The serial coil type motor 100 may include a stator 110 and a rotor 120, as shown in FIG. 3.

The rotor 120 can be located at the center of the stator 110 at a predetermined distance from the stator 110 such that the rotor 120 can rotate in a predetermined direction facing the stator 110. The rotor 120 may include a shaft located at the center thereof, a rotor core surrounding the shaft and having a predetermined width, protrusions extended to the rotor core from the outer wall of the rotor core, and permanent magnets having a first polarity, which are attached to the outer wall of the rotor core.

The stator 110 has a hollow cylindrical shape having a predetermined thickness and includes a plurality of slots arranged at a predetermined interval. The stator 110 may have a cylindrical form such that it forms the perimeter of the motor and the inside of the cylinder may correspond to a space in which the rotor 120 can be located. The stator 110 may be formed of a material capable of generating a magnetic circuit, such as iron. The stator 110 includes the plurality of slots each of which is wound by a coil by a predetermined number of winding turns. The stator 110 may be arranged at a predetermined distance from the permanent magnets having the first polarity, which are included in the rotor 120. External current may be sequentially supplied to the coils winding the slots of the stator 110. Accordingly, the slots of the stator 110 sequentially function as electromagnets and the rotor 120 located inside the stator 110 is rotated by the slots of the stator 110, which function as electromagnets. Particularly, the first polarity permanent magnets can rotate in a predetermined direction by forming a specific magnetic circuit with the slots of the stator 110.

As described above, the coils included in the stator 110 wind around the slots of a stator core. The outside of each coil is covered with an insulator such that inter-turn short circuit is not generated between neighboring coils. However, the insulating property of the insulator is deteriorated according to high voltage and heat with time, generating inter-turn short circuit between neighboring coils. Inter-turn short circuit degrades the performance of the serial coil type motor 100, the turn-short coils form a circuit, and high current is induced according to magnetic flux of the magnets and the stator 110. The generated high current causes copper loss to promote generation of heat and severe damage to the insulator of a near coil, destroying the serial coil type motor 100 or resulting in fire. The permanent magnet motor 10 according to the present invention can mathematically model electrical variation in a coil due to inter-turn short circuit and can easily detect a phase of the serial coil type motor 100, which has a fault, and a degree of the fault on the basis of the mathematical model.

The serial coil type motor 100 is designed such that it has 3-phase-balanced impedance and counter electromotive force. In case of turn short, impedance and counter electromotive force decrease only in a phase having inter-turn short circuit and a turn-short coil forms an independent circuit. If the serial coil type motor 100 is driven when this kind of fault is generated, current or voltage is unbalanced to cause a negative sequence distinguished from normal 3 phases. The negative sequence has a rotational rate opposite to that of a positive sequence. If the positive sequence generates a rotating field in the rotating direction of the serial coil type motor 100, the negative sequence forms a rotating field in the opposite direction. Accordingly, the rotating field of the negative sequence is regarded as disturbance twice the rotating velocity of the positive sequence from the viewpoint of the positive sequence. The negative sequence is a component in which 3 phase of a, b and c are formed in the order or a, c and b, distinguished from the positive sequence in which the 3 phases are formed in the order of a, b and c. Phases b and c are mathematically different from each other. The positive sequence and negative sequence can be represented by Equations 1 and 2.

$$f_{ap} = A_P\cos(wt)$$
$$f_{bp} = A_P\cos\left(wt - \frac{2\pi}{3}\right)$$ [Equation 1]
$$f_{cp} = A_P\cos\left(wt + \frac{2\pi}{3}\right)$$

$$f_{an} = A_P\cos(wt)$$
$$f_{bn} = A_P\cos\left(wt + \frac{2\pi}{3}\right)$$ [Equation 2]
$$f_{cn} = A_P\cos\left(wt - \frac{2\pi}{3}\right)$$

Here, $f_{ap}$, $f_{bp}$ and $f_{cp}$ mathematically represent the 3-phase positive sequence and $f_{an}$, $f_{bn}$, and $f_{cn}$, mathematically represent the 3-phase negative sequence. As represented by the equations, the phases of the positive sequence and the negative sequence are reverse to each other. The negative sequence is generated at phase current or voltage of the motor although generation of the negative sequence depends on a control method.

The present invention can derive a mathematical model to a synchronous reference frame from abc coordinates of the motor and detect the quantity of a fault and a phase having the fault on the basis of the mathematical model.

$$\begin{bmatrix} v_a \\ v_b \\ v_c \\ 0 \end{bmatrix} = R_s \begin{bmatrix} i_a \\ i_b \\ i_c \\ i_f \end{bmatrix} + L_s \frac{d}{dt} \begin{bmatrix} i_a \\ i_b \\ i_c \\ i_f \end{bmatrix} + \omega\psi_m \begin{bmatrix} -\left(1 - \frac{2}{P}(1-x)\right)\sin\theta \\ -\sin\left(\theta - \frac{2\pi}{3}\right) \\ -\sin\left(\theta + \frac{2\pi}{3}\right) \\ -(1-x)\frac{2}{P}\sin\theta \end{bmatrix}$$ [Equation 3]

Equation 3 is a magnetic flux equation of the motor in the abc coordinates on the assumption that a fault corresponding to x (the ratio of a good coil to a faulty phase and a faulty pole pair) is generated in A-phase. The model of the serial coil type motor 100 is based on concentrated winding having 3N slot in case of 2N pole. $R_p$ and $L_p$ in Equation 3 can be represented by Equation 4.

In Equation 3, $v_a$, $v_b$, and $V_c$ denote phase voltages of the motor and f denotes a closed circuit generated caused by coil turn short. P is a pole number and P/2 is a pole pair number. In addition, x denotes the ratio of a faultless coil to a faulty pole, $L_m$, and $L_l$ respectively denote self inductance and leakage inductance of each phase when the motor is in a normal state, and R is a phase resistance component.

$R_f$ is a contact resistance component generated due to inter-turn short circuit and γ is a coupling factor of pole pairs in the same as a specific phase in a slot having the specific phase. γ can improve accuracy of a corresponding model when inter-turn short circuit is generated although γ is not applied to the balanced normal serial coil type motor 100. That is, when the serial coil type motor 100 includes multiple poles and magnetic flux generated in a coil slot of one phase is varied, the flux variation affects magnetic flux generated in a distant coil slot in the same phase. For example, when magnetic flux generated in a coil slot of one phase decreases, the quantity of magnetic flux transmitted to a distant coil slot having the same phase is reduced. Accordingly, it is difficult to represent various states of the multi-pole serial coil type motor 100 using a simple equivalent model. While there is no need to consider deviation in the flux quantity in a balanced normal state, when an independent circuit loop is generated due to turn short, the independent circuit loop is coupled with a coil of the same phase in a normal state and thus affected by the coil. Accordingly, the present invention corrects the deviation using γ. That is, the fault detector 700 according to the present invention applies flux reduction generated due to turn short of a coil of a specific phase in the motor having multiple phases and multiple poles to calculation of inductance.

When the values of $i_a$, $i_b$ and $i_c$ in Equation 3 are set using the compensation current calculator 600 such that negative sequence current is not present and applied to the negative sequence current controller 300, balance currents represented by Equation 6 can be applied to the positive sequence current controller 200 and a signal output from the positive sequence current controller 20 can be applied to the inverter 400.

$$i_a = -I_q\sin\theta + I_d\cos\theta$$ [Equation 5]
$$i_b = -I_q\sin\left(\theta - \frac{2\pi}{3}\right) + I_d\cos\left(\theta - \frac{2\pi}{3}\right)$$

[Equation 4]

$$R_s = \begin{bmatrix} R + (x-1)\frac{2}{P}R + R_f & 0 & 0 & -R_f \\ 0 & R & 0 & 0 \\ 0 & 0 & R & 0 \\ -R_f & 0 & 0 & (1-x)\frac{2}{P}R + R_f \end{bmatrix}$$

$L_s =$ $$\begin{bmatrix} L_m\left(1 + \frac{2/P}{1-\gamma}(x^2-1) + \frac{\gamma 4/P}{1-\gamma}(1-x)\right) + \left(\frac{2}{P}x^2 + 1 - \frac{2}{P}\right)L_l & \left(-\frac{1}{2} + \frac{1-x}{P}\right)L_m & \left(-\frac{1}{2} + \frac{1-x}{P}\right)L_m & -(1-x)\gamma\frac{2}{P}\frac{L_m}{1-\gamma} + x(1-x)\frac{2}{P}\frac{L_m}{1-\gamma} \\ \left(-\frac{1}{2} + \frac{1-x}{P}\right)L_m & L_m + L_l & -\frac{1}{2}L_m & -\frac{1-x}{P}L_m \\ \left(-\frac{1}{2} + \frac{1-x}{P}\right)L_m & -\frac{1}{2}L_m & L_m + L_l & -\frac{1-x}{P}L_m \\ -(1-x)\gamma\frac{2}{P}\frac{L_m}{1-\gamma} + x(1-x)\frac{2}{P}\frac{L_m}{1-\gamma} & -\frac{1-x}{P}L_m & -\frac{1-x}{P}L_m & (1-x)^2\frac{2}{P}\frac{L_m}{1-\gamma} + \frac{2}{P}(1-x)^2 L_l \end{bmatrix}$$

-continued
$$i_c = -I_q \sin\left(\theta + \frac{2\pi}{3}\right) + I_d \cos\left(\theta + \frac{2\pi}{3}\right).$$

When the currents of Equation 5 are applied to Equation 3 to convert the currents and current $i_f$ flowing through a separate independent circuit according to turn short into the synchronous reference frame, Equation 6 can be obtained.

[Equation 6]
$$i_f = \frac{R_{s44}(\omega I_q(L_{s41} - L_{s42}) - R_{s41}I_d)\omega - L_{s44}\left(R_{s41}\omega I_q + \omega^2\psi_m(1-x)\frac{2}{P} + \omega^2 I_d(L_{s41} - L_{s42})\right)\omega}{R_{s44}^2 + (L_{s44}\omega)^2}\cos\omega t + \frac{R_{s44}\left(R_{s41}\omega I_q + \omega^2\psi_m(1-x)\frac{2}{P} + \omega^2 I_d(L_{s41} - L_{s42})\right) + L_{s44}(\omega I_q(L_{s41} - L_{s42}) - R_{s41}I_d)\omega^2}{R_{s44}^2 + (L_{s44}\omega)^2}\sin\omega t$$

$$\begin{bmatrix} V_{de}^+ \\ V_{qe}^+ \end{bmatrix} = \frac{1}{3}\begin{bmatrix} I_d(R_{s11} + 2R_{s22}) + R_{s14}k_1 + \omega I_q(-L_{s11} + 2L_{s12} - 2L_{s22} + L_{s23}) + \omega k_2(L_{s14} - L_{s24}) \\ I_q(R_{s11} + 2R_{s22}) - R_{s14}k_2 - \omega I_d(-L_{s11} - 2L_{s22} + L_{s23} + 2L_{s12}) + \omega\psi_m\left(3 - \frac{2}{P}(1-x)\right) + \omega k_1(L_{s14} - L_{s24}) \end{bmatrix}$$

$$\begin{bmatrix} V_{de}^- \\ V_{qe}^- \end{bmatrix} = \frac{1}{3}\begin{bmatrix} I_d(R_{s11} - R_{s22}) + R_{s14}k_1 + \omega I_q(-L_{s11} + 2L_{s12} + L_{s22} - 2L_{s23}) + \omega k_2(L_{s14} - L_{s24}) \\ -I_q(R_{s11} - R_{s22}) + R_{s14}k_2 + \omega\psi_m\left(\frac{2}{P}(1-x)\right) + \omega I_d(-L_{s11} + 2L_{s12} + L_{s22} - 2L_{s23}) - \omega k_1(L_{s14} - L_{s24}) \end{bmatrix}$$

In application of the above equations, x becomes 1 when the serial coil type motor 100 has no fault. Current components of the serial coil type motor 100 can be controlled to be DC in a positive sequence synchronous reference frame of the serial coil type motor 100 having no fault. When a fault is generated in the serial coil type motor 100, a negative sequence is generated as represented by the equation, a current compensation value for the negative sequence is calculated by the compensation current calculator 600 and applied to the negative sequence current controller 300, and then an output value of the negative sequence current controller 300 is applied to an output value of the positive sequence current controller 200. Particularly, the fault detector 700 filters the output signal of the negative sequence current controller 300 to which the current compensation value calculated by the compensation current calculator 600 has been applied and applies the filtered signal to the above equations so as to detect the position of a faulty phase, that is, x. Upon detection of the faulty phase and x, it is possible to detect an operating point at which dielectric breakdown does not occur due to overcurrent in the serial coil type motor 100 by controlling a velocity and phase current which can limit $i_f$. To achieve this, the fault detector 700 can provide information about a fault value to a control system.

The inverter 400 is configured to provide a predetermined voltage, e.g. 3-phase voltage to the motor 100. The inverter 400 receives 3-phase current generated and provided by a current controller, generates a control signal corresponding to the 3-phase current to produce an inverter voltage and supplies the inverter voltage to the serial coil type motor 100. Particularly, the inverter 400 can generate a control signal for compensating for a fault of a specific phase due to turn short of the serial coil type motor 100 and provide the control signal to the serial coil type motor 100. Here, signals supplied to the inverter 400 may include a signal corresponding to a current reference value to which a faulty phase and a degree of fault, detected by the fault detector 700, have been applied and a current compensation value determined to remove a negative sequence component.

The positive sequence current controller 200 is configured to generate a signal corresponding to a current reference value pre-defined to drive the serial coil type motor 100 and provide the generated signal to the inverter 400. Specifically, the positive sequence current controller 200 receives a fault compensation value for compensating for a fault caused by inter-turn short circuit of the serial coil type motor 100 from the compensation current calculator 600 and applies the fault compensation value to the current reference value to generate a signal to be provided to the inverter 400. Particularly, the positive sequence current controller 200 can receive the current reference value to which the faulty phase and the degree of fault detected by the fault detector 700 from the control system, apply the output value of the negative sequence current controller 300 to the current reference value, and then provide the current reference value to the inverter 400. Accordingly, the positive sequence current controller 200 according to the present invention can generate and provide a signal corresponding to a current value that minimizes error caused by inter-turn short circuit even when the inter-turn short circuit is generated in the serial coil type motor 100.

The negative sequence current controller 300 is configured to generate an output value to which a current compensation value calculated to minimize a negative sequence component generated during operation of the serial coil type motor 100 and an output value to which the current reference value provided by the control system have been applied. The value generated by the negative sequence current controller 300 can be provided to the fault detector 700 and the positive sequence current controller 200.

The current sensor 500 is configured to sense a signal supplied from the inverter 400 to the serial coil type motor 100 or a signal according to operation of the serial coil type motor 100. The current sensor 500 senses a 3-phase current signal or a 3-phase voltage signal provided to the serial coil type motor 100 and provides the sensed signal to the compensation current calculator 600. Particularly, the current sensor 500 can sense a 3-phase current signal according to operation of the serial coil type motor 100 and provide the sensed 3-phase current signal to the compensation current calculator 600. Here, the sensed 3-phase current signal corresponds to current sensing values at positions at which 3 phases can be discriminated and can be represented as a current vector.

The compensation current calculator 600 is configured to calculate a current compensation value according to the current reference value using current vector values sensed by the current sensor 500 and provide the current reference value to the positive sequence current controller 200 and the negative sequence current controller 300. The compensation current calculator 600 can convert the 3-phase current signal sensed by the current sensor 500 into a 2-phase d-q synchronous reference frame, perform filtering and calculate a 2-phase d-q synchronous reference frame signal using a rotating phasor for application of polar coordinates. The current compensation value calculated by the compensation current calculator 600 is a value for removing the negative sequence component.

The fault detector 700 filters the signal supplied from the negative sequence current controller 300 to the positive sequence current controller 200 into a DC component and applies the DC component to a corresponding equation. The fault detector 700 is configured to provide a d-q synchronous reference frame voltage according to generation of fault. The fault detector 700 mathematically considers inductance in a phase having a fault and, particularly, can calculate the inductance in consideration of the influence of magnetic flux generated in a specific slot of a specific phase on a different slot of the same phase. That is, the fault detector 700 can calculate a value controlling negative sequence current generated in the serial coil type motor 100 more accurately by considering flux variation in a different slot of the same phase when $L_p$ in Equation 4 is applied, and thus the fault detector 700 can support operation of the serial coil type motor 100 such that the influence of inter-turn short circuit of the serial coil type motor 100 is minimized. Accordingly, the fault detector 700 can confirm x in the serial coil type motor 100 having a fault on the basis of the output of the negative sequence current controller 300 and the fault model configured using the above equations.

Figure 5:
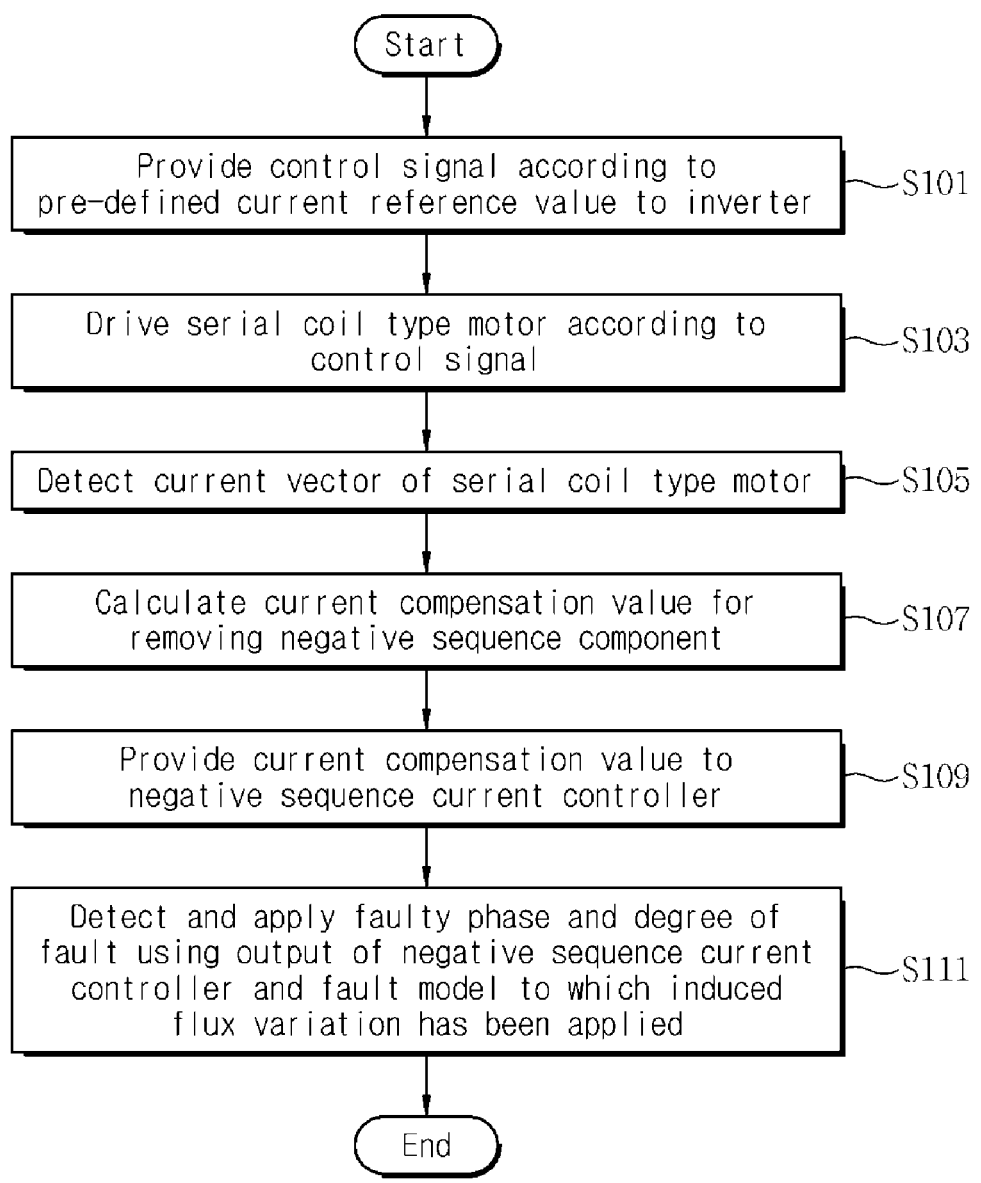
FIG. 5 is a flowchart illustrating a method for detecting a fault of a serial coil type permanent magnet motor to which a fault model according to an embodiment of the present invention is applied.

FIG. 5 is a flowchart illustrating a method for detecting a fault of a serial coil type permanent magnet motor according to an embodiment of the present invention.

Referring to FIG. 5, the positive sequence current controller 200 generates a control signal of the inverter 400 according to a pre-defined current reference value and provides the generated control signal to the inverter 400 in step S101.

The inverter 400 generates a control signal for driving the serial coil type motor 100 on the basis of the output of the positive sequence current controller 200 and provides the generated control signal to the serial coil type motor 100 to drive the serial coil type motor 100 in step S103.

The current sensor 500 detects current vectors according to operation of the serial coil type motor 100 and provides the detected current vectors to the compensation current calculator 600 in step S105. Then, the compensation current calculator 600 calculates a current compensation value for removing a negative sequence component on the basis of the current vectors in step S107.

Upon calculation of the current compensation value by the compensation current detector 600, the current compensation value is provided to the negative sequence current controller 300 and the positive sequence current controller 200 in step S109. Here, the fault detector 700 detects a faulty phase and a degree of fault by applying a fault value of a negative sequence component, output from the negative sequence current controller 300, to a magnetic flux equation in step S111. To achieve this, the fault detector 700 can configure a fault model considering a specific phase in which inter-turn short circuit is generated and a degree of fault in the specific phase using a magnetic flux equation obtained by applying a negative sequence current component to a positive sequence current component. Particularly, the fault detector 700 applies an induced flux variation γ capable of using not only a flux variation generated in a specific slot of a specific phase having a fault but also a flux variation generated in a different slot of the same phase, induced according to the flux variation of the same phase, to inductance of the magnetic flux equation. Accordingly, the fault detector 700 according to the present invention can accurately apply an actual negative sequence component generated in the serial coil type motor 100 to the fault model to control a motor velocity and phase current optimized to the fault model. Fault values detected by the fault detector 700 are provided to the control system that provides a current reference value. The control system can generate the current reference value to which the fault values have been applied and provide the current reference value to the positive sequence current controller 200 and the negative sequence current controller 300.

Figure 6:
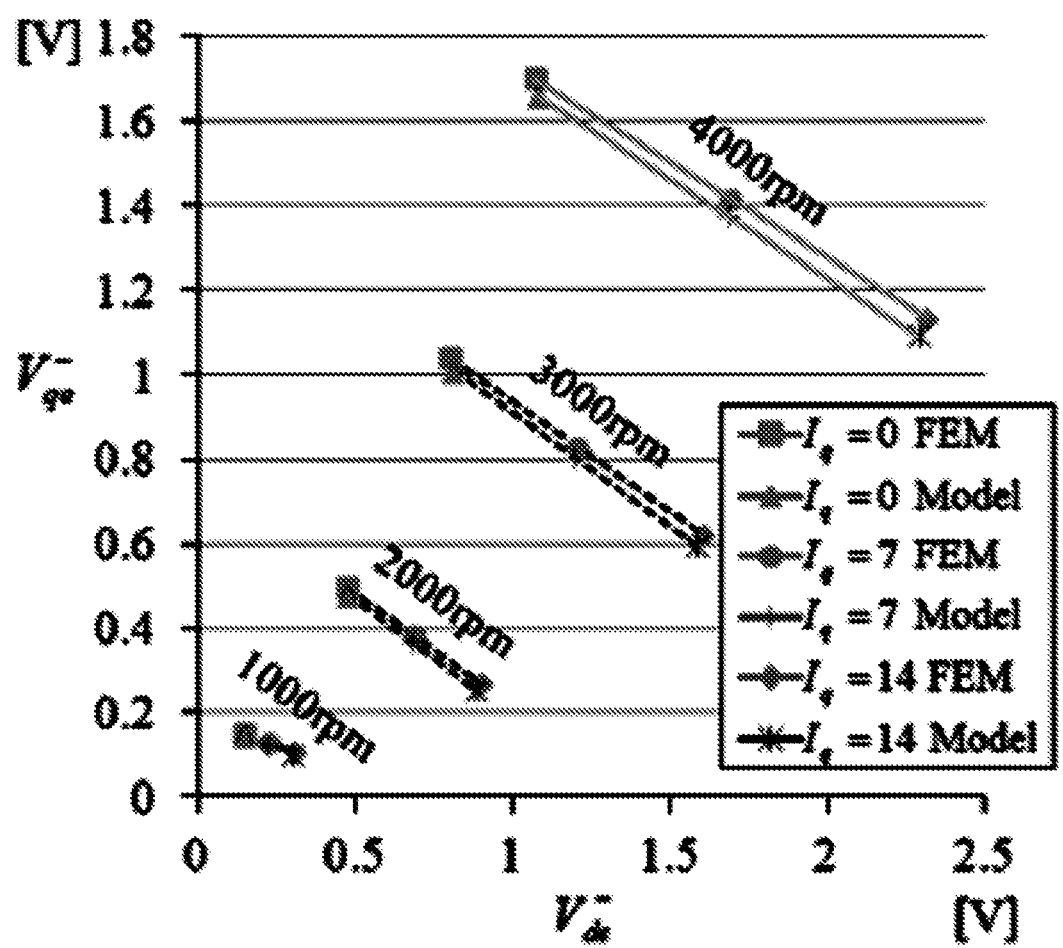
FIGS. 6 and 7 are graphs for explaining accuracy of the fault model according to the embodiment of the present invention.
Figure 7:
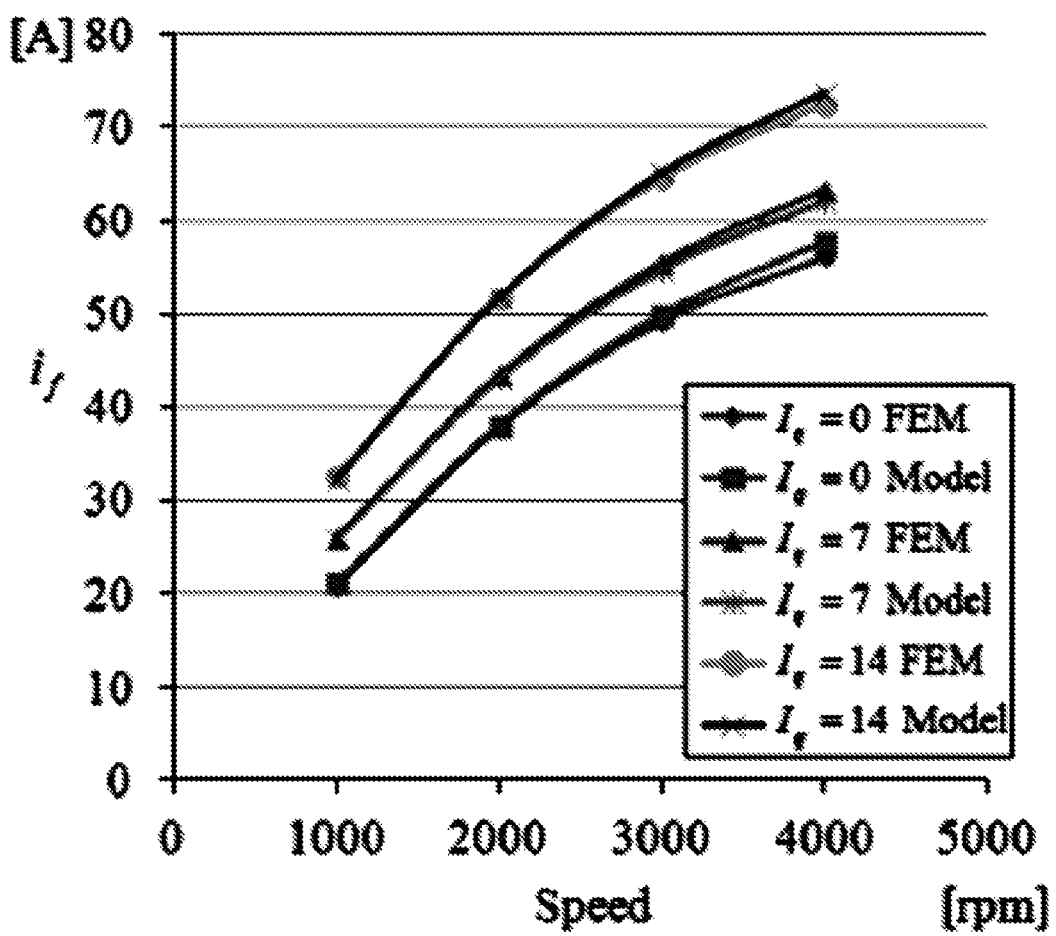

FIGS. 6 and 7 are graphs showing model accuracy according to application of the fault model according to an embodiment of the present invention. FIG. 6 shows FEM simulation based accuracy and FIG. 7 shows $i_f$ current accuracy.

FIG. 6 shows values measured on the basis of a 6-pole 9-slot serial coil type motor (rated 18 Vrms) and x=0.6666 (in case of coil turn short of 300% in one slot) to check model accuracy through FEM analysis. The graph of FIG. 6 shows a negative sequence voltage output. In FIG. 6, x-axis shows Vde- and y-axis shows Vqe-. It can be known from FIGS. 6 and 7 that the negative sequence voltage output and current $i_f$ very similar to actual values are detected. Particularly, the fault model according to the present invention can be easily applied to various types of motors because the fault model is mathematically calculated.

As described above, the method for detecting a fault of a serial coil type permanent magnet motor and the system supporting the same according to embodiments of the present invention detect a fault caused by inter-turn short circuit of the serial coil type motor 100 using the mathematically configured fault model and, when a fault is generated, accurately detects a faulty phase and a degree of fault in consideration of a flux variation in a slot of a phase having turn short and flux variations in other slots of the same phase. Accordingly, the present invention can calculate an operating point at which the serial coil type motor 100 is not additionally damaged and drive the serial coil type motor 100 by applying a correct current reference value and a negative sequence current compensation value suitable to the faulty phase and the degree of fault.

The detailed description of the preferred embodiments of the present invention has been given to enable those skilled in the art to implement and practice the invention. Although the invention has been described with reference to the preferred embodiments, those skilled in the art will appreciate that various modifications and variations can be made in the present invention without departing from the spirit or scope of the invention described in the appended claims.

What is claimed is:

1. A system supporting detection of a fault of a serial coil type permanent magnet motor, the system comprising:
   a serial coil type motor;
   a current sensor configured to sense stator phase current of the motor;
   a compensation current calculator configured to calculate a current compensation value for a negative sequence component generated in the motor on the basis of the sensed phase current;

a positive sequence current controller configured to generate a control signal for an inverter control by using the current compensation value and also using a current reference value provided from a control system;
a negative sequence current controller configured to generate a signal for removing the negative sequence component by using both the current compensation value and the current reference value, and then to provide the signal to the positive sequence current controller;
an inverter configured to generate a motor operation signal according to the control signal;
a fault detector configured to detect a faulty phase and a degree of a fault by applying the output of the negative sequence current controller to a mathematically defined fault model; and the control system configured to provide the current reference value to which the faulty phase and the degree of fault are applied, wherein the fault model of the fault detector is a fault model to which a magnetic flux variation in a specific slot of a specific faulty phase of the motor and an induced magnetic flux variation in a slot of the same phase as the specific phase are applied.

2. The system of claim 1, wherein the compensation current calculator is further configured to convert a 3-phase voltage into a 2-phase synchronous reference frame, and then to calculate the current compensation value for compensating for the negative sequence component.

3. The system of claim 2, wherein balanced currents of the motor for compensating for the negative sequence component are $$i_a = -I_q \sin\theta + I_d \cos\theta$$
$$i_b = -I_q \sin\left(\theta - \frac{2\pi}{3}\right) + I_d \cos\left(\theta - \frac{2\pi}{3}\right)$$
$$i_c = -I_q \sin\left(\theta + \frac{2\pi}{3}\right) + I_d \cos\left(\theta + \frac{2\pi}{3}\right).$$

4. The system of claim 3, wherein the motor is a 3-phase motor and, and when a fault corresponding to x (the ratio of a faultless coil to a faulty phase and faulty pole pair) is generated in A-phase, a magnetic flux equation of the fault model is $$\begin{bmatrix} v_a \\ v_b \\ v_c \\ 0 \end{bmatrix} = R_s \begin{bmatrix} i_a \\ i_b \\ i_c \\ i_f \end{bmatrix} + L_s \frac{d}{dt} \begin{bmatrix} i_a \\ i_b \\ i_c \\ i_f \end{bmatrix} + \omega\psi_m \begin{bmatrix} -\left(1 - \frac{2}{P}(1-x)\right)\sin\theta \\ -\sin\left(\theta - \frac{2\pi}{3}\right) \\ -\sin\left(\theta + \frac{2\pi}{3}\right) \\ -(1-x)\frac{2}{P}\sin\theta \end{bmatrix}$$

wherein $R_s$ and $L_s$ are $$R_s = \begin{bmatrix} R + (x-1)\frac{2}{P}R + R_f & 0 & 0 & -R_f \\ 0 & R & 0 & 0 \\ 0 & 0 & R & 0 \\ -R_f & 0 & 0 & (1-x)\frac{2}{P}R + R_f \end{bmatrix}$$

$$L_s = \begin{bmatrix} L_m\left(1 + \frac{2/P}{1-\gamma}(x^2-1) + \frac{\gamma 4/P}{1-\gamma}(1-x)\right) + \left(\frac{2}{P}x^2 + 1 - \frac{2}{P}\right)L_l & \left(-\frac{1}{2} + \frac{1-x}{P}\right)L_m & \left(-\frac{1}{2} + \frac{1-x}{P}\right)L_m & -(1-x)\gamma\frac{2}{P}\frac{L_m}{1-\gamma} + x(1-x)\frac{2}{P}\frac{L_m}{1-\gamma} \\ \left(-\frac{1}{2} + \frac{1-x}{P}\right)L_m & L_m + L_l & -\frac{1}{2}L_m & -\frac{1-x}{P}L_m \\ \left(-\frac{1}{2} + \frac{1-x}{P}\right)L_m & -\frac{1}{2}L_m & L_m + L_l & -\frac{1-x}{P}L_m \\ -(1-x)\gamma\frac{2}{P}\frac{L_m}{1-\gamma} + x(1-x)\frac{2}{P}\frac{L_m}{1-\gamma} & -\frac{1-x}{P}L_m & -\frac{1-x}{P}L_m & (1-x)^2\frac{2}{P}\frac{L_m}{1-\gamma} + \frac{2}{P}(1-x)^2 L_l \end{bmatrix}$$

wherein $v_a$, $v_b$, and $v_c$ denote phase voltages of the motor, f denotes a closed circuit generated caused by coil turn short, P is a pole number, P/2 is a pole pair number, $L_m$ and $L_l$ respectively denote self inductance and leakage inductance of each phase when the motor is in a normal state, R is a phase resistance component, $R_f$ is a contact resistance component generated due to inter-turn short circuit, x denotes the ratio of a faultless coil to a faulty pole, and γ is a coupling factor of pole pairs in the same as a specific phase in a slot having the specific phase.

5. The system of claim 4, wherein fault current $i_f$ due to turn short circuit is $$i_f = \frac{R_{s44}(\omega I_q (L_{s41} - L_{s42}) - R_{s41}I_d)\omega - L_{s44}\left(R_{s41}\omega I_q + \omega^2\psi_m(1-x)\frac{2}{P} + \omega^2 I_d(L_{s41} - L_{s42})\right)\omega}{R_{s44}^2 + (L_{s44}\omega)^2} \cos\omega t + $$

$$\frac{R_{s44}\left(R_{s41}\omega I_q + \omega^2\psi_m(1-x)\frac{2}{P} + \omega^2 I_d(L_{s41} - L_{s42})\right) + L_{s44}(\omega I_q (L_{s41} - L_{s42}) - R_{s41}I_d)\omega^2}{R_{s44}^2 + (L_{s44}\omega)^2} \sin\omega t.$$

6. The system of claim 5, wherein a synchronous reference frame value of a voltage value obtained by filtering the output of the negative sequence current controller is as follows $$\begin{bmatrix} V_{de}^+ \\ V_{qe}^+ \end{bmatrix} = \frac{1}{3} \begin{bmatrix} I_d(R_{s11} + 2R_{s22}) + R_{s14}k_1 + \omega I_q(-L_{s11} + 2L_{s12} - 2L_{s22} + L_{s23}) + \omega k_2(L_{s14} - L_{s24}) \\ I_q(R_{s11} + 2R_{s22}) - R_{s14}k_2 - \omega I_d(-L_{s11} - 2L_{s22} + L_{s23} + 2L_{s12}) + \omega \psi_m\left(3 - \frac{2}{P}(1-x)\right) + \omega k_1(L_{s14} - L_{s24}) \end{bmatrix}$$

$$\begin{bmatrix} V_{de}^- \\ V_{qe}^- \end{bmatrix} = \frac{1}{3} \begin{bmatrix} I_d(R_{s11} - R_{s22}) + R_{s14}k_1 + \omega I_q(-L_{s11} + 2L_{s12} + L_{s22} - 2L_{s23}) + \omega k_2(L_{s14} - L_{s24}) \\ -I_q(R_{s11} - R_{s22}) + R_{s14}k_2 + \omega \psi_m\left(\frac{2}{P}(1-x)\right) + \omega I_d(-L_{s11} + 2L_{s12} + L_{s22} - 2L_{s23}) - \omega k_1(L_{s14} - L_{s24}) \end{bmatrix}.$$

7. A method for detecting a fault of a serial coil type permanent magnet motor, the method comprising the steps of:
  driving the serial coil type permanent motor based on a predefined current reference value;
  detecting a phase current vector of the motor;
  calculating a current compensation value for removing a negative sequence component of the motor based on the phase current vector;
  providing the current compensation value to a negative sequence current controller and calculating a faulty phase and a degree of a fault of the serial coil type permanent motor using the output of the negative sequence current controller and a fault model to which induced magnetic flux variations in a specific slot of a specific faulty phase of the serial coil type permanent motor and other slots of the same phase as the specific phase are applied; and
  applying a current reference value to which the calculated faulty phase and degree of fault are applied.

8. The method of claim 7, wherein the step of applying the current reference value includes adjusting the velocity and phase current of the motor based on the faulty phase and degree of fault to suppress generation of overcurrent.

* * * * *